Figure 1:
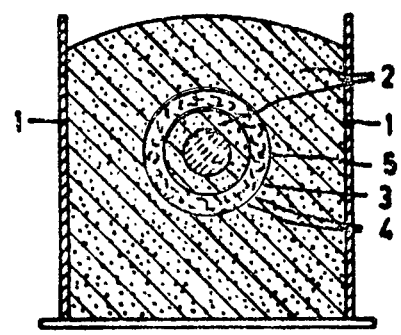

United States Patent [19]
Knippenberg et al.

[11] 3,962,406
[45] June 8, 1976

[54] METHOD OF MANUFACTURING SILICON CARBIDE CRYSTALS

[75] Inventors: Wilhelmus Franciscus Knippenberg; Gerrit Verspui, both of Eindhoven, Netherlands

[73] Assignee: U.S. Philips Corporation, New York, N.Y.

[22] Filed: Aug. 15, 1972

[21] Appl. No.: 280,763

Related U.S. Application Data

[63] Continuation of Ser. No. 778,550, Nov. 25, 1968, abandoned.

[30] Foreign Application Priority Data

Nov. 25, 1967 Netherlands ..................... 6716070

[52] U.S. Cl. ............................................. 423/345
[51] Int. Cl.² ......................................... C01B 31/36
[58] Field of Search .................................... 423/345

[56] References Cited
UNITED STATES PATENTS

| | | | |
|---|---|---|---|
| 2,854,364 | 9/1958 | Lely | 423/345 |
| 3,275,415 | 9/1966 | Chang et al. | 423/345 |
| 3,460,987 | 7/1969 | McMillan et al. | 117/228 X |
| 3,647,384 | 3/1972 | Dessureault | 423/345 |

FOREIGN PATENTS OR APPLICATIONS

| | | | |
|---|---|---|---|
| 1,536,842 | 1967 | France | 423/345 |
| 1,810,504 | 1969 | Germany | 423/345 |
| 43-18829 | 1965 | Japan | 423/345 |

OTHER PUBLICATIONS

Phillips Research Reports, vol. 18, No. 3, pp. 171-174, (1963).

*Primary Examiner*—Oscar R. Vertiz
*Assistant Examiner*—Eugene T. Wheelock
*Attorney, Agent, or Firm*—Frank R. Trifari; Ronald L. Drumheller

[57] ABSTRACT

A method of manufacturing silicon carbide crystals in which a core of silicon dioxide is embedded in a mass of granular silicon carbide, or materials which form silicon carbide on heating this mass being heated to a temperature at which silicon dioxide volatilizes, i.e. above about 1500°C, and the silicon carbide coheres. This leaves a cavity, formerly occupied by the silicon dioxide which is surrounded by silicon carbide. Heating is then continued at a temperature, above about 2500°C, at which silicon carbide crystals are formed on the walls of the cavity.

8 Claims, 3 Drawing Figures

U.S. Patent  June 8, 1976  3,962,406

METHOD OF MANUFACTURING SILICON CARBIDE CRYSTALS

This is a continuation of application Ser. No. 778,550, filed Nov. 25, 1968 now abandoned.

The invention relates to the manufacture of silicon carbide crystals by condensation and/or recrystallisation on the wall of a space bounded by silicon carbide.

It is known that in this manner well defined plate-shaped crystals can be obtained at temperatures of between 2000°C and 2600°C, i.e. approximately 2500°C (French patent specifications 1,138,273 and 1,225,566). When lanthanum is present in the crystallisation space, whisker-like silicon carbide crystals can also be formed in this manner.

It has already been pointed out in the above-mentioned literature that the conductivity properties of the formed crystals can be influenced by supplying additions, for example, nitrogen, boron and aluminum, to the crystallisation atmosphere.

In the known methods the crystallisation cavities were produced in various manners.

As described in French patent specification 1,138,273 the space around a core arranged in a graphite crucible is filled with lumps of silicon carbide. After tamping or merely tapping it is found that the lumps engage each other with their sharp edges in such manner that the core can be removed without any objection.

This method can only be carried out with comparatively large angular lumps. As a result of this the structure of the formed crystallisaton wall becomes inhomogeneous and its surface becomes very irregular. As a result of this the temperature conditions for the crystals growing on this surface become very uneven which hampers the production of a batch of uniform crystals.

As a further possibility the above-mentioned French patent specification 1,138,273 proposes to coat the inside of a graphite crucible with a lining consisting of silicon carbide in powder form and a binder, for example, water-glass. However, the drawback of the use of binders is that they form a source of impurities for the silicon carbide. Moreover, destruction of binders must generally be carried out slowly and carefully.

According to the French patent specification 1,225,566 a core is likewise arranged in a graphite crucible and the intermediate space is filled-up with silicon carbide. In this example the core consists of a very thin-walled graphite cylinder which is not removed. A practical difficulty is to obtain graphite cylinders with the required low wall thickness of between 0.05 and 0.3 mm. It has been found in addition that only few crystals grow on such a wall.

It is furthermore described in Philips Research Reports, Vol. 18, nr. 3, p. 258 that a hollow cylinder suitable as a crystallisation space, can be obtained by sintering fine-grained silicon carbide in a graphite mould at approximately 2300°C and then removing the mould. Although in this manner a cavity is obtained which has a uniform wall surface and the yield of similar crystals upon crystallisation on said wall is large, a drawback is that the crystallisation space has always to be manufactured in a separate operation.

Finally, a drawback of the known methods is, that in practice one is restricted as regards the shape and dimensions of the crystallisation cavities. This is a drawback in particular if crystallisation is to be carried out on the scale of a technical Acheson process (see, for example, Philips Research Reports, vol. 18, nr. 3 pp. 171 et seq.).

According to the invention, the said drawbacks do not occur if, for forming cavities, a core material is used which, upon heating already before reaching the temperature at which the crystals are grown and in the presence of the gas atmosphere to be used in the crystallisation process, fully disappears, but, until coherence of the silicon carbide is obtained, is still operative in such manner that the cavities do not cave in. Furthermore, in particular in those cases in which one does not want to be restricted to the dimensions of the cavities, it is of importance that the core material can be processed in a mouldable state, for example, as a powder, grains, or as a plastic mass.

It has further been found that silicon dioxide which, in accordance with the requirements which are imposed upon the purity of the crystals, can be used in the form of sand or clay to pure silicon dioxide, is a particularly suitable core-material for the above purpose.

In this connection it is to be noted that in this specification and the appended claims the term "silicon dioxide" is to be understood to include mixtures and compounds having a high content of silicon dioxide, for example, glass and clay, as far as the above requirements for the core material are valid.

This core material volatilizes upon heating and the silicon carbide coheres before reaching the temperature at which the manufacture of the crystals takes place. It has been found that the vapours of the core material have a favourable influence on the coherence of the silicon carbide mass.

The invention relates to a method of manufacturing silicon carbide crystals by condensation and/or recrystallisation in a crystallisation space bounded by silicon arbide, characterized in that a core of silicon dioxide is provided in granular silicon carbide or in a mixture of substances which upon heating forms silicon carbide the assembly being then heated at temperatures at which the core of silicon dioxide volatilizes and the silicon carbide coheres, after which the crystals are produced in the formed cavity. Suitable temperatures for forming said crystals may be from 2000°C to 2600°C, whereas a protecting gas atmosphere may be used.

Generally, plate-shaped silicon carbide crystals are formed. If, however, the crystallisation is carried out in the presence of an element from the group IIIB of the Periodic System of the elements, particularly in the presence of lanthanum, in the crystallisation cavities, filamentary crystals, in technology referred to as whiskers, are obtained. The elements of group IIIB comprise scandium, yttrium, the rare earth metals including lanthanum, and actinium.

In order to obtain cavities of large dimensions which have to be formed, for example, in carrying out the crystallisation in an Acheson cycle, cores may be formed locally by depositing sand during the conventional construction from a mixture of sand with carbon or products supplying carbon upon heating. Supporting material which determines the shape of the core may be used, for example, partition-walls during the constructon can be removed or combustible partition-walls, for example, consisting of paper, wood or plastics, which are converted into silicon carbide or disappear upon firing.

Upon heating by means of the centrally arranged electrical heating element consisting of carbon, silicon carbide is formed which coheres, while the cores of sand volatilize, so that crystallisation cavities are formed on the wall of which crystals grow when temperatures of, for example, approximately 2500°C are reached.

If only the growth of large crystals and whiskers is aimed at, it has been found to be of advantage to form the cavities in a silicon carbide mass already prepared previously, because therein great volume variations and material displacements upon heating do not occur as in the known Acheson cycle.

In processes in which a greater purity is desirable, and which will generally be carried out on a smaller scale, the starting material will preferably be pure silicon carbide or raw materials which are converted into silicon carbide upon heating, and the cores are formed from pure silicon dioxide.

If the process is carried out on a considerably smaller scale, silicon dioxide in the form of a thin-walled tube may be used as a silicon dioxide core for forming a cavity, so that the use of temporary supporting material for the core in the construction may be omitted.

Summarizing, the invention in its various embodiments has the advantage that crystallisation cavities can always be created with a cheap core material and in a simple manner substantially without any restriction as regards dimensions and shape and without separate processes.

In order that the invention may be readily carried into effect, a few examples thereof will now be described in greater detail, reference being made to the accompanying drawing.

EXAMPLE I

As shown in the diagrammatic cross-sectional view shown in FIG. 1, an Acheson furnace is constructed by providing in a space of $3 \times 3 \times 10 m^3$ a mixture 2 of 40% coke, 50% sand, 7% sawdust and 3% common salt between the walls 1 of corrugated sheet-iron and providing centrally therein a carbon rod-shaped electric heater element 3, diameter 60 cm.

Simultaneously with the provision of the mixture, six torus-shaped sand cores 5, inside diameter 65 cm, outside diameter 75 cm, and having a rectangular cross-section, width 100 cm, at mutual distances of 40 cm, are formed concentrically with the core of carbon 3 by means of paper moulds 4.

Heating is carried out by means of the heater element 3. At a temperature of approximately 1500°C, the reaction

$$SiO_2 + 3C \rightarrow SiC + 2CO$$

in the mixture 2 sets in.

Coaxial zones of silicon carbide, outside diameter approximately 2 m, are formed in the mixture around the heater element 3 in a few hours at temperatures increasing to 1900°C. In so far as the mixture is not converted into silicon carbide during the heating cycle, this serves as a heat insulation and may be used again in a following cycle.

The presence of the sawdust in the starting mixture produces a porous silicon carbide mass, so that the carbon monoxide formed during the reaction and serving as a protective gas can circulate through the mass and, if necessary, can escape without the gas pressure increasing to excessive values. Some common salt has been added to the mixture to stimulate the reaction and to convert impurities into volatile chlorides.

During the heating the paper moulds 4 burn or get charred. The sand 5 of the cores volatilizes already noticeably from 1500°C so that the surrounding silicon carbide coheres at an early stage in the cycle and caving in of the cavity which is formed by complete volatilisation of the sand core, is prevented.

During the further heating of the silicon carbide until temperatures of approximately 2500°C are reached at the area of the cavities to be formed, the sand core 5 volatilizes entirely, and plate-shaped silicon carbide crystals deposit evenly on the wall of the cavities facing the carbon core 3. The yield per cavity is on an average four crystals per sq. cm. The thickness of the crystals is up to a few mms, and their area from ½ to 1 sq. cm.

EXAMPLE II

Figure 2:
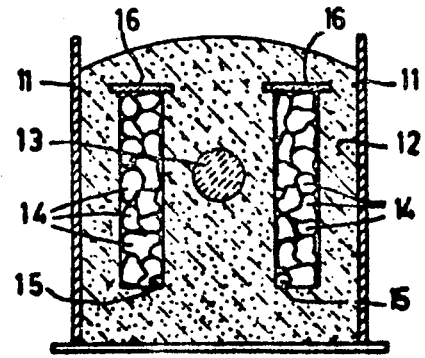

As shown in the diagrammatic cross-section of FIG. 2, a space of $3 \times 3 \times 10 m^3$ bounded by walls 11 of corrugated sheet, is filled with pure lightgreen coloured silicon carbide 12 obtained in an Acheson cycle from pure raw materials. A rod-shaped heater element 13 of pure carbon, diameter 60 cm, is formed in said space.

By means of plastic pouches 14 filled with pure silicon dioxide, longitudinal spaces of 50 cm wide are saved in the silicon carbide over a length of 8 m parallel to the element 13. When a first layer of pouches 14 is laid, small pouches 15 filled with 25 gms of lanthanum oxide are provided at mutual distances of 1m. The last layer of pouches is covered with carbon plates 16.

Heating is carried out by means of the element 13, a protective carbon monoxide atmosphere being formed by the partial burning of the carbon of which it exists. After the plastic pouches have been burned volatilisation of the silicon dioxide in the form of sub-oxides which stimulate the coherence of the silicon carbide 12 taken place in the temperature range of from 1500°C to 2500°C so that longitudinal cavities are formed before the temperatures above 2500°C are reached at which crystallisation is carried out. In these passages colourless whisker-like silicon carbide crystals are deposited under the influence of the lanthanum oxide present.

After crystallisation for 4 hours, the yield is approximately ½ kgm per $m^2$ on the warmest wall of the cavity over a wall-surface-strip of approximately 1 m. wide. The resulting whiskers are ribbon-shaped and have a width of a few tenths of a mm. and a thickness up to 0.1 mm. The majority of the crystals have a length of a few cms.

After removing the crystals from the wall and supplying lanthanum oxide again, the crystallisation process can be repeated a few times in the same device.

EXAMPLE III

Figure 3:
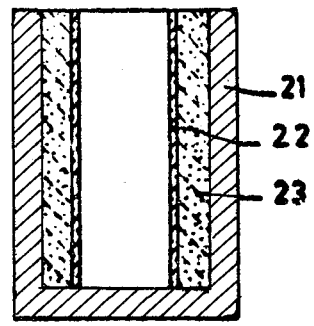

As shown in the diagrammatic cross-sectional view of FIG. 3, a tube 22 of borate glass, outside diameter 45 mm, length 100 mm, is placed in a graphite crucible 21, height 100 mm, inside diameter 70 mm. Between the crucible and the tube, granular silicon carbide 23 obtained in an Acheson process is provided.

The assembly is heated to 2550°C in an argon atmosphere in two hours, the glass tube disappearing and a cylindrical cavity being formed in the silicon carbide. After heating for 4 hours at the above temperature, the wall of the cavity is fully covered with plate-shaped crystals of borium-doped silicon carbide, dimensions $5 \times 8 \times 0.5 mm^3$. The yeild is some hundreds of crystals.

EXAMPLE IV

In the manner decribed in example III, a cavity is formed in a crucible of pyrographite by means of a thin-walled quartz tube in a mass of pure silicon carbide in the form of yellow, acicular crystals prepared by pyrolysis of methyl chlorosilane. After traversing the temperature cycle stated in the above example in an atmosphere of pure helium, plate-shaped silicon carbide crystals of a very high purity are obtained. The wall of the cavity is completely covered with crystals. The yield is some hundreds of crystals.

What is claimed is:

1. A method of forming silicon carbide crystals on a wall of silicon carbide, comprising the steps of:
    positioning within a mass of loose granular material comprising silicon carbide or the constituents thereof a core consisting essentially of silicon dioxide, said core preventing said loose granular material from entering an intended cavity defined and occupied by said core;
    gradually raising the temperature of said mass and core until a coherent wall of silicon carbide forms around said core and said core volatilizes leaving said intended cavity bounded by a coherent wall of silicon carbide; and
    maintaining the temperature of said cavity and coherent wall within the range of 2000°C to 2600°C until silicon carbide crystals form within said cavity on said coherent wall.

2. A method as defined in claim 1 wherein the temperature of said cavity and coherent wall is maintained at approximately 2500°C.

3. A method as defined in claim 1 wherein said core or loose granular material also contains lanthanum oxide to promote formation of whisker-like silicon carbide crystals.

4. A method as defined in claim 1 wherein said loose granular material comprises a mixture of coke, sand, sawdust and common salt and said core consists essentially of sand.

5. A method as defined in claim 1 wherein said core is a combustible mould substantially filled with a granular material consisting essentially of silicon dioxide.

6. A method as defined in claim 1 wherein said core consists esentially of glass.

7. A method as defined in claim 6 wherein said glass core is hollow.

8. A method as defined in claim 6 wherein said glass core is composed of borate glass, thereby forming boron-doped silicon carbide crystals on said coherent wall of said cavity.

* * * * *